United States Patent [19]
Busick et al.

[11] Patent Number: 6,003,318
[45] Date of Patent: Dec. 21, 1999

[54] THERMOELECTRIC WATER COOLER

[75] Inventors: Louis M. Busick, Columbus, Ohio; Bruce D. Burrows, Valencia, Calif.

[73] Assignee: Oasis Corporation, Columbus, Ohio

[21] Appl. No.: 09/067,723

[22] Filed: Apr. 28, 1998

[51] Int. Cl.[6] .................................................. F25B 21/02
[52] U.S. Cl. ................................................. 62/3.64; 62/59
[58] Field of Search ............................... 62/3.64, 59, 139, 62/3.2

[56] References Cited

U.S. PATENT DOCUMENTS

| | | | |
|---|---|---|---|
| 3,327,485 | 6/1967 | Bush | 62/3.64 |
| 4,476,690 | 10/1984 | Iannelli | 62/59 |
| 4,745,759 | 5/1988 | Bauer et al. | 62/3.2 |
| 4,752,389 | 6/1988 | Burrows | 210/181 |
| 4,843,830 | 7/1989 | Haul | 62/59 |
| 4,880,535 | 11/1989 | Burrows | 210/181 |
| 5,072,590 | 12/1991 | Burrows | 62/3.64 |
| 5,192,004 | 3/1993 | Burrows | 222/146.6 |
| 5,370,276 | 12/1994 | Burrows | 222/146.6 |
| 5,413,152 | 5/1995 | Burrows | 141/18 |
| 5,435,909 | 7/1995 | Burrows | 210/85 |
| 5,501,077 | 3/1996 | Davis et al. | 62/3.64 |
| 5,513,495 | 5/1996 | West et al. | 62/3.64 |
| 5,527,450 | 6/1996 | Burrows | 210/85 |
| 5,544,489 | 8/1996 | Moren | 62/3.64 |
| 5,560,211 | 10/1996 | Parker | 62/3.64 |
| 5,580,444 | 12/1996 | Burrows | 210/85 |
| 5,627,310 | 5/1997 | Johnson | 62/59 |

Primary Examiner—William E. Tapolcai
Attorney, Agent, or Firm—Kelly Bauersfeld Lowry & Kelley, LLP

[57] ABSTRACT

A water cooler is provided with a thermoelectric heat transfer module for chilling water within a cooler reservoir. The water cooler includes a sensor mounted in a position to detect build-up of an ice bank within the cooler reservoir, and to provide a signal to a controller which regulates the thermoelectric module to prevent excessive ice bank growth. The water cooler further includes an air filter for filtering air drawn by a fan to circulate over a heat sink associated with the thermoelectric module, wherein the air filter is adapted for quick and easy access and removal for periodic cleaning or replacement. The thermoelectric module and air filter are included as part of a chiller subassembly adapted for quick and easy assembly with a water cooler housing for use in chilling water within the reservoir, and also for quick and easy disassembly from the water cooler housing for service or replacement, if required.

62 Claims, 10 Drawing Sheets

THERMOELECTRIC WATER COOLER

BACKGROUND OF THE INVENTION

This invention relates generally to improvements in devices and systems for cooling a supply of water used for drinking, cooking, etc. More particularly, this invention relates to improvements in a water cooler of the type equipped with a compact thermoelectric heat transfer module for quietly chilling water within a cooler reservoir.

Bottled water coolers are well known in the art for containing a supply of relatively purified water in a convenient manner and location ready for substantially immediate dispensing and use. Such water coolers commonly include an upwardly open reservoir adapted to receive and support a water bottle of typically three to five gallon capacity in an inverted orientation such that bottled water may flow downwardly into the cooler reservoir. A spigot on the front of a cooler housing is operable at any time to dispense the water in selected amounts. Such bottled water coolers are widely used to provide a clean and safe source of drinking water, especially in areas wherein the local water supply may or is suspected to contain undesired levels of contaminants. Alternative so-called point-of-use water coolers are also known in the art wherein the cooler is connected to a water supply line and includes water filtration and/or purification means such as a reverse osmosis unit for purifying water supplied to the cooler reservoir.

In many water coolers of the type described above, it is desirable to refrigerate the water within the cooler reservoir to a relatively low temperature to provide a highly pleasing and refreshing source of drinking water. However, refrigeration equipment for such water coolers has typically comprised conventional compressor-type mechanical refrigeration systems which undesirably increase the overall cost, complexity, size, operational noise level, and power consumption requirements of the water cooler. Alternative cooling system proposals have suggested the use of relatively compact and quiet thermoelectric heat transfer modules, such as the system shown and described in U.S. Pat. No. 5,072,590. In such proposals, a thermoelectric module is mounted with a cold side thereof disposed in heat transfer relation with water in the cooler reservoir, and a hot side associated with a heat sink for dissipating heat drawn from the water. A cooling fan is normally provided to circulate air over the heat sink for improved heat transfer efficiency.

While thermoelectric chiller systems are relatively simple in construction and quiet in operation, such systems have nevertheless exhibited important drawbacks which have limited their widespread adoption and use. More specifically, the chilling capacity of the thermoelectric module is relatively small as compared to a conventional compressor-type refrigeration system, resulting in a relatively slow recovery time following a large withdrawal or several successive withdrawals of water from the reservoir. To offset this problem, the thermoelectric module has typically been operated so as to develop an ice bank within the reservoir for substantially immediate chilling of make-up water following a large withdrawal. Unfortunately, this reliance upon an ice bank for prompt chilling of make-up water requires the thermoelectric module to be operated substantially on a full-time basis, with resultant excessive energy use and risk of freeze-up of the reservoir. One attempt to control ice bank growth has involved the use of baffles disposed within the reservoir in a position intended to prevent reservoir freeze-up, but the use of such baffles does not address the problem of excessive energy usage. Another attempt has involved regulation of the heat transfer rate from the reservoir by speed control of the cooling fan used to circulate a convective air flow over the heat sink, in response to variations in ambient air temperature. However, this latter approach also does not address the problem of excessive energy usage, and further has been generally ineffective due to inaccurate temperatures readings caused by accumulation of dust and dirt on temperature sensor surfaces. Air filters have been proposed to control dust and dirt accumulation, but these filters have been difficult to access for cleaning or replacement.

There exists, therefore, a significant need for improvements in and to water coolers of the type having a thermoelectric heat transfer module for chilling water within a cooler reservoir, particularly with respect to providing an improved system for regulating the module in a manner to prevent excessive ice bank build-up while reducing overall energy requirements. Moreover, there exists a need for further improvements with respect to facilitated access to an air filter associated with a heat sink cooling fan. The present invention fulfills these needs and provides further related advantages.

SUMMARY OF THE INVENTION

In accordance with the invention, an improved water cooler is provided with a thermoelectric heat transfer module for chilling water within a cooler reservoir. The thermoelectric module is mounted at the base of a thermally conductive chiller probe positioned in heat transfer relation with the reservoir water, such as by extending directly into the reservoir. A cold side of the thermoelectric module is disposed in heat transfer relation with the chiller probe, and a hot side of the module is disposed in heat transfer relation with a heat sink. The chiller probe additionally carries a sensor disposed within the reservoir for detecting an ice bank therein, and for signaling a controller which regulates module operation in a manner to control ice bank size and growth.

In one preferred form, the sensor comprises a conductivity sensor in the form of a small probe mounted to protrude a short distance from the tip or distal end of the chiller probe within the reservoir. The conductivity sensor is associated with a conductivity circuit, such as that described in U.S. Pat. No. 5,580,444, forming a part of the controller, for periodic monitoring of the conductivity between a pair of exposed electrodes on the tip of the sensor. The conductivity sensor in thus capable of detecting ice bank growth sufficient to cover the probe, as evidenced by a substantial increase in detected resistance. The controller responds to the detected ice bank covering the conductivity sensor to regulate power to the thermoelectric module in a manner to prevent excessive ice bank build-up and to reduce module energy consumption. In a preferred form, the controller reduces the power supplied to the thermoelectric module by pulse width modulation, or by on-off cycling. In addition, or in the alternative, the controller may function to regulate operation of the thermoelectric module by varying the speed of a cooling fan provided to draw air across and through the heat sink to dissipate heat drawn from the reservoir water by the thermoelectric module.

An air filter is provided at the air intake side of the heat sink to filter dust and particulate from the convective air flow, and thereby prevent accumulation of dust and particulate on the heat sink surfaces. The air filter is mounted in a slide-out tray positioned on a cooler housing for convenient access, such as at the front of the cooler housing, to permit quick and easy removal of the air filter for cleaning and/or replacement.

The thermoelectric module is clamped securely between a lower end of the chiller probe and the heat sink, and these components are assembled in turn with the cooling fan and a base frame to provide a compact chiller subassembly adapted for quick and easy installation into and/or removal from a housing for the water cooler. In a preferred form, this chiller subassembly is designed for quick and easy mounting into an open lower end of a compact housing for a counter top water cooler, with the chiller subassembly and the housing including interengageable latch members for simplified interconnection and disassembly, for example, as by a part-circle turning movement therebetween to engage or disengage the latch members. With this construction, the entire chiller subassembly can be removed from the cooler housing quickly and easily for repair or service if and when required.

Alternative sensor arrangements may be provided, such as a temperature sensor mounted on or within the chiller probe. The temperature sensor detects temperature fluctuations indicative of ice bank growth to signal the controller for appropriate regulation of the thermoelectric module. In another alternative form, optical detection means mounted on or within the reservoir can be used to monitor ice bank growth.

Other features and advantages of the invention will become more apparent from the following detailed description taken in conjunction with the accompanying drawings which illustrate, by way of example, the principles of the invention.

BRIEF DESCRIPTION OF THE DRAWINGS

The accompanying drawings illustrate the invention. In such drawings.

DETAILED DESCRIPTION OF THE PREFERRED EMBODIMENTS

Figure 1:
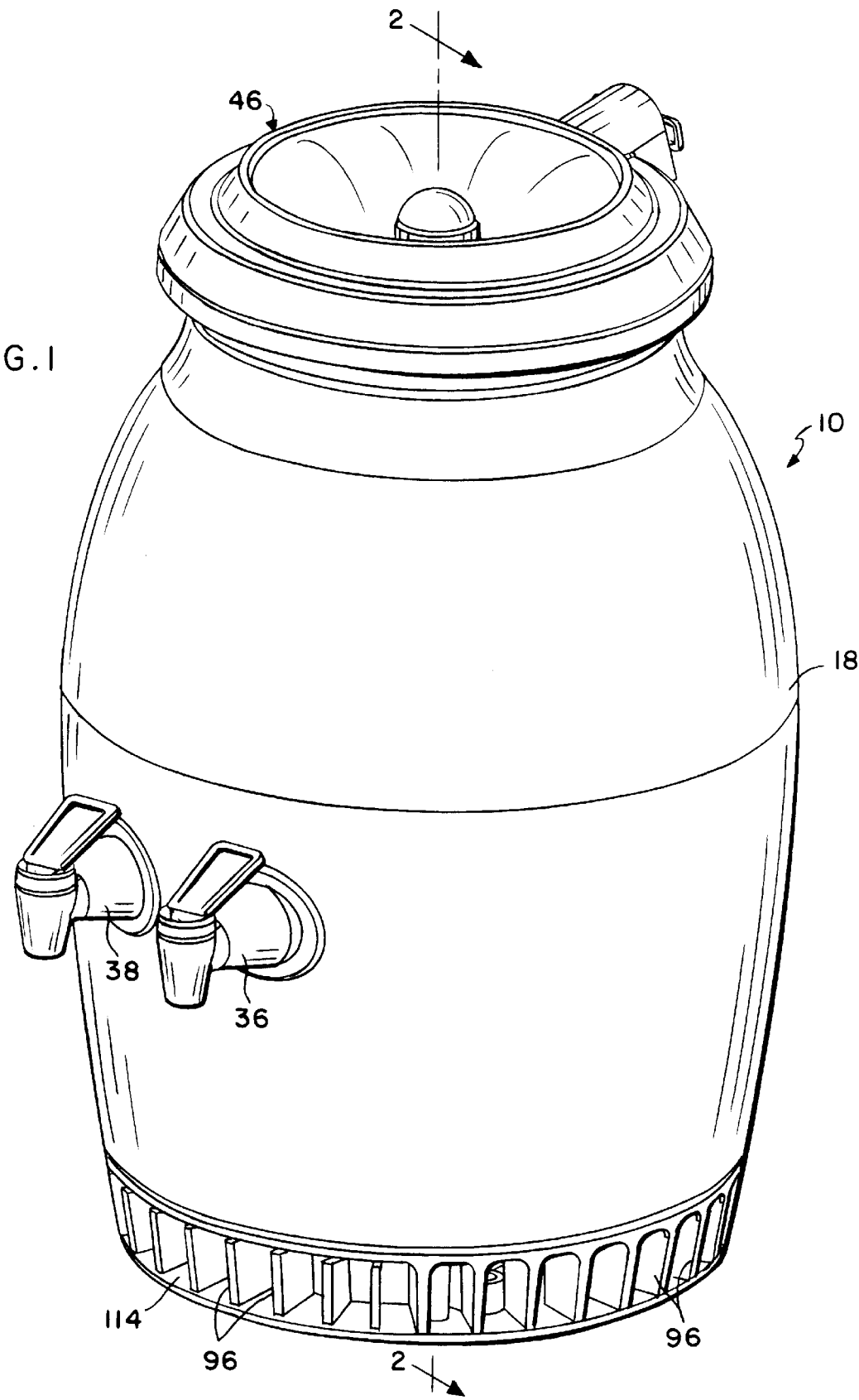
FIG. 1 is perspective view illustrating a counter top water cooler including thermoelectric chiller means in accordance with the novel features of the invention.

As shown in the exemplary drawings, a water cooler referred to generally by the reference numeral 10 in FIGS. 1–4 includes a thermoelectric heat transfer module 12 for chilling water within a cooler reservoir 14. The thermoelectric heat transfer module 12 is provided as part of a relatively compact chiller subassembly 16 (FIG. 4b) adapted for quick and easy assembly with and also for quick and easy disassembly from a housing 18 for the water cooler 10. In addition, the chiller subassembly 16 includes a sensor such as a conductivity sensor 20 disposed directly within the cooler reservoir 14 to take conductivity readings reflective of growth of an ice bank 21 (FIGS. 2–3) within the reservoir, in combination with a controller 22 (FIG. 5) which functions in response to the conductivity readings to regulate operation of the chiller subassembly in a manner to regulate and control the size of the ice bank.

Figure 2:
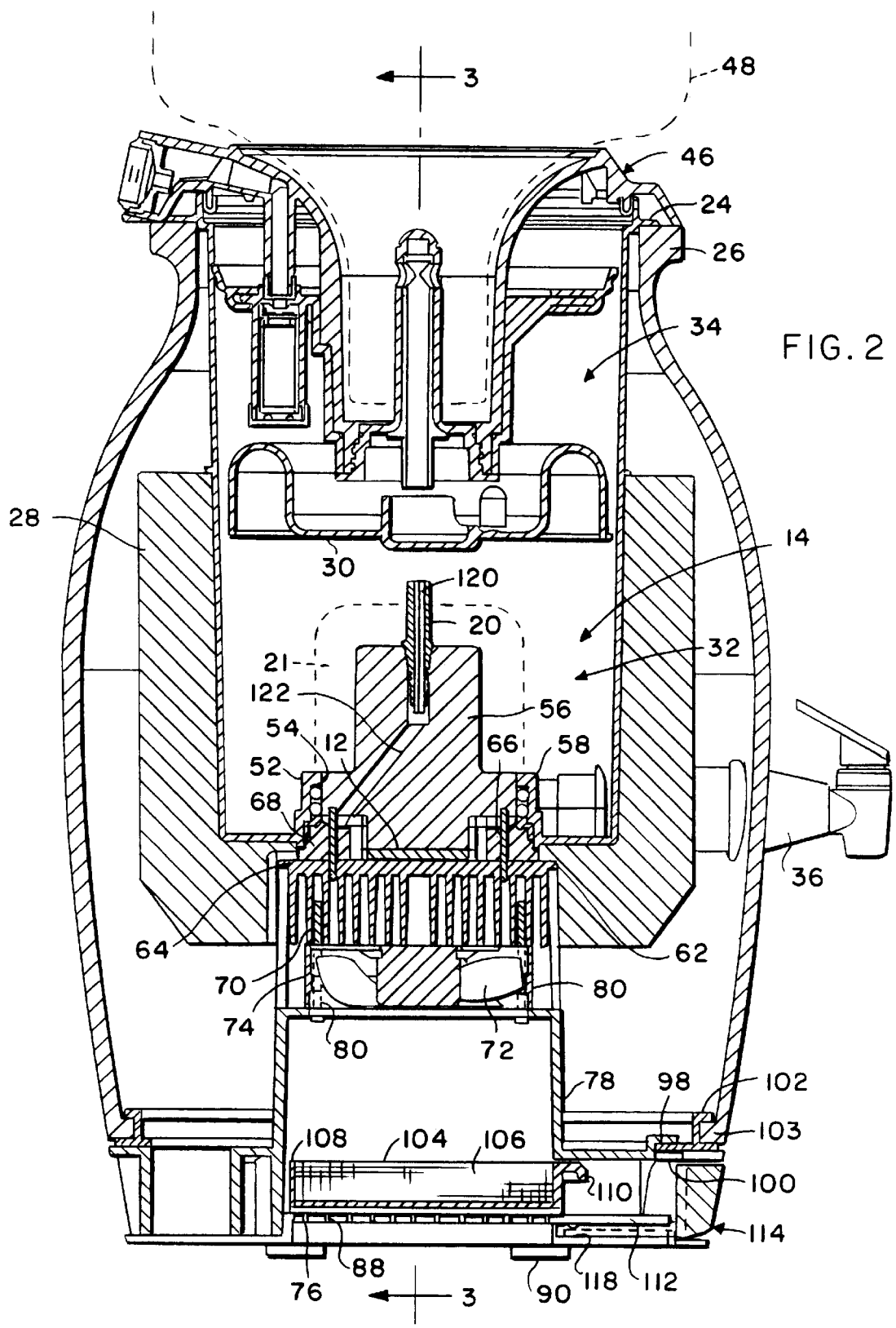
FIG. 2 is a vertical sectional view taken generally along the line 2—2 of FIG. 1.
Figure 3:
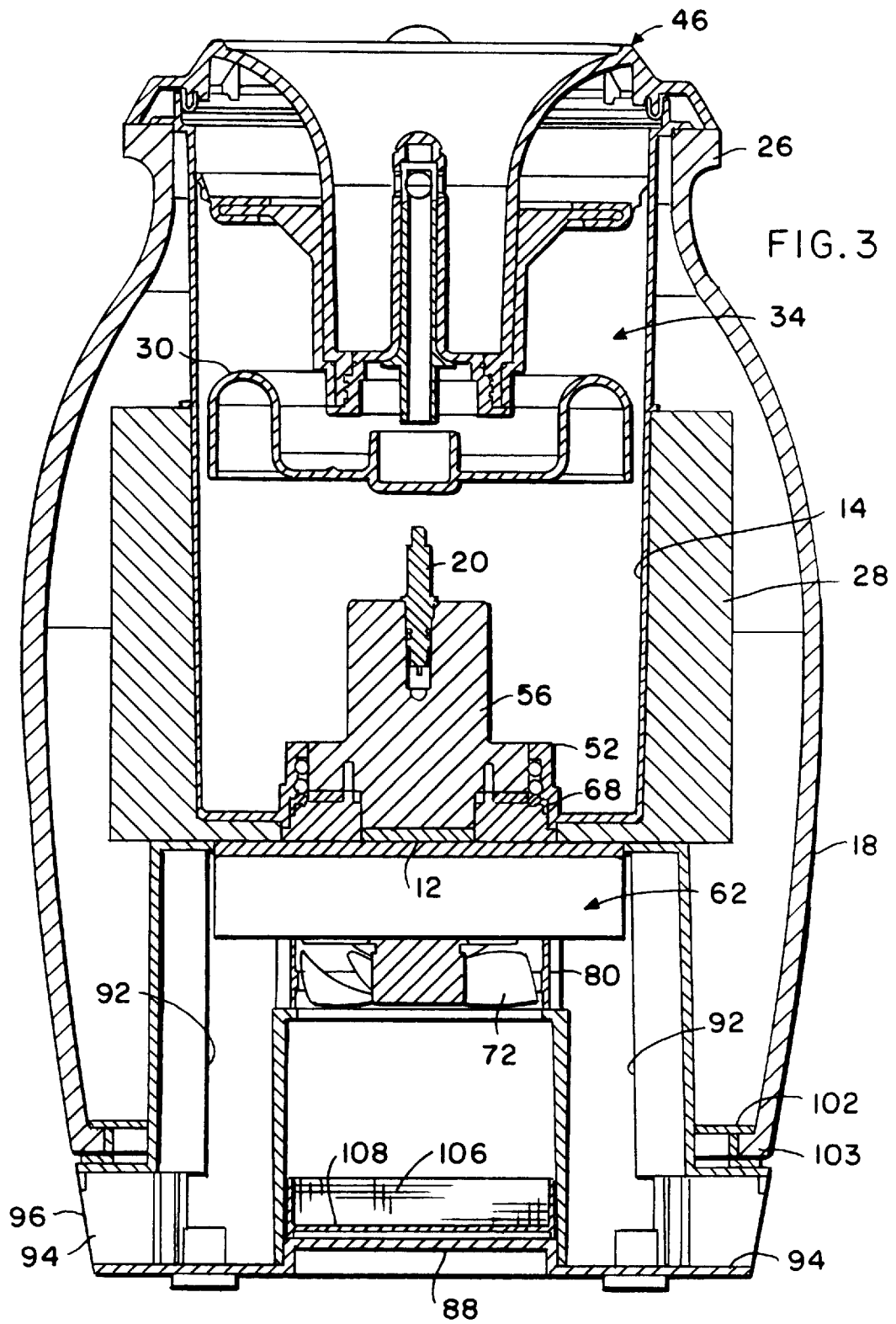
FIG. 3 is a transverse vertical sectional view taken generally along the line 3—3 of FIG. 2.
Figure 4A:
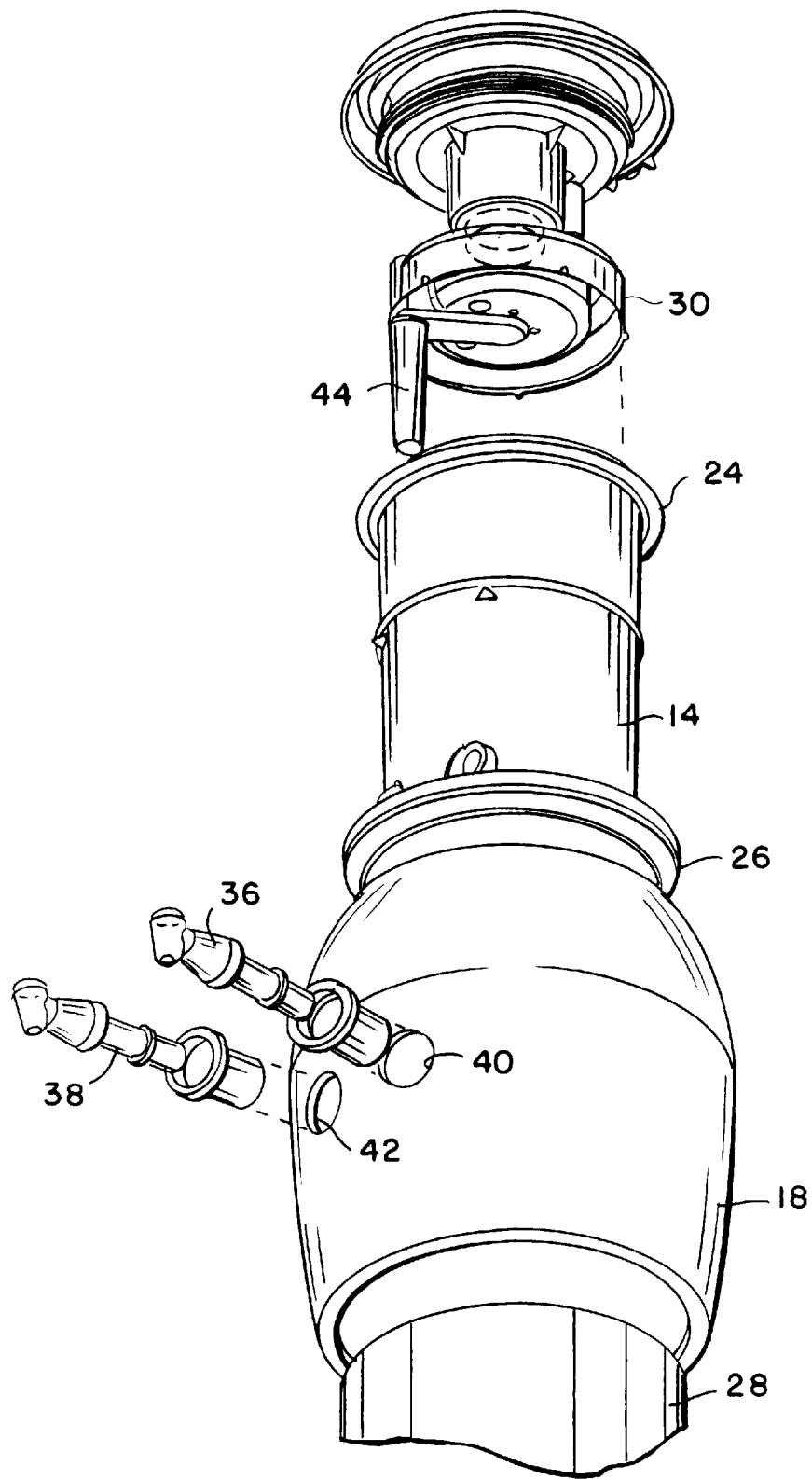
FIGS. 4a and 4b are exploded perspective views showing assembly of the various components of the water cooler of FIGS. 1–3.

The water cooler 10 depicted in the illustrative drawings comprises a counter top type cooler having a housing 18 of compact size and shape suitable for placement onto a counter top (not shown). The housing 18 for such counter top application may have a ceramic or earthenware construction defining an open top for receiving and supporting the upwardly open reservoir 14 having an upper flange 24 rested upon an upper rim 26 of the cooler housing. In a preferred form, the reservoir 14 is constructed from molded plastic for slide-fit installation into and slide-out removal from the housing 18, with an upwardly open generally cup-shaped insulation block 28 mounted within the housing to receive and support the reservoir in a position for normal operation. FIGS. 2–4 show a conventional baffle plate 30 installed within the reservoir 14 to subdivide the reservoir volume into a lower chilled water chamber 32 and an upper chamber 34 for containing a quantity of water substantially at room temperature. A pair of faucets 36 and 38 are mounted through a respective pair of faucet ports 40 and 42 formed in a front face of the cooler housing 18 for respectively dispensing water from the lower and upper chambers 32, 34. In this regard, a flow tube 44 (FIG. 4a) formed as part of the baffle plate 30 provides a flow connection between the upper chamber 34 and the room temperature faucet 38, as is known in the art and as further shown and described in U.S. Pat. Nos. 5,192,004 and 5,370,276, which are incorporated by reference herein.

The illustrative water cooler 10 additionally includes a feed tube adapter unit 46 (FIGS. 2–4) for receiving and supporting a water bottle 48 (FIG. 2) in an inverted position over the cooler reservoir 14. This feed tube adapter unit 46, in the preferred form, is constructed as shown and described in U.S. Pat. No. 5,413,152, which is also incorporated by reference herein. The feed tube adapter unit is designed to engage and open a valved bottle cap on the water bottle 48 to permit downward flow of water from the bottle into the reservoir, with a concurrent upward flow of replacement air from the reservoir into the interior of the bottle. Persons skilled in the art, however, will recognize and appreciate that use of the feed tube adapter unit 46 is optional and may be omitted in which case the shoulder of the inverted water bottle can be seated directly upon the upper rim 26 of the cooler housing.

The cooler reservoir 14 has a cylindrical collar 52 formed in a bottom wall thereof to define an opening 54 for slide-fit reception of a chiller probe 56 mounted at the top of the chiller subassembly 16. More particularly, as shown best in FIGS. 2–4, the reservoir collar 52 is lined internally with one or more seal rings 58 for sealed sliding fit engagement with an outer peripheral surface of the chiller probe 56, when the reservoir 14 is fully installed and seated within the cooler housing 18. Accordingly, the reservoir collar 52 and chiller probe 56 cooperatively seal the bottom of the reservoir to prevent water leakage therefrom, and further to position the chiller probe 56 directly within the chilled water chamber 32 in direct contact with water therein.

The chiller probe 56 is formed from a material of relatively high thermal conductivity, such as suitable metal stock including stainless steel, or aluminum which can be surface coated with a thin layer of epoxy or Teflon to prevent corrosion. A lower end of the chiller probe 56 comprises a generally planar surface retained in intimate contact with a cold side of the thermoelectric heat transfer module 12. One such heat transfer module is available form Borg-Warner Corporation under model designation 920-31, and employs semiconductor materials with dissimilar characteristics (P-type and N-type materials) connected electrically in series and thermally in parallel. The module 12 operates to draw or extract thermal energy at the cold side, thereby extracting heat from the water within the reservoir 14 via the chiller probe 56, and to transfer the extracted heat at a hot side thereof to a thermally conductive heat sink 62 formed from aluminum or the like.

As shown, the heat sink 62 comprises a generally planar baseplate 64 clamped securely against the hot side of the module 12 by a plurality of screws 66 extending upwardly through the baseplate 64 and fastened into the chiller probe 56. The mounting screws 66 desirably pass through an annular insulation ring 68 retained under compression between the chiller probe 56 and the heat sink 62, to encircle the thermoelectric module 12. This mounting arrangement effectively clamps the module 12 securely between the heat transfer components for efficient heat transfer from the water in the reservoir to the heat sink. Thermally conductive paste-type coatings or wafers (not shown) may be interposed between the module 12 and the adjacent components to enhance the heat transfer.

The heat sink 62 includes a plurality of heat dissipation fins 70 projecting downwardly from the baseplate 64. The fins 70 are spaced apart to define elongated air flow passages therebetween for circulation of cooling air to carry away the collected heat energy. As shown in FIGS. 2–4, a cooling fan 72 is mounted directly beneath the heat sink 62 for circulating air past the fins 70 for heat dissipation.

More particularly, the cooling fan 72 is provided preferably in the form of a pancake fan assembly for coaxial through flow of air when the fan is rotatably driven. The fan assembly includes a compact fan shroud 74 designed for clamped assembly sandwiched between the overlying heat sink 62 and one end of an air inlet duct 76 formed as part of a base frame 78 of the chiller subassembly 16. A plurality of mounting screws 80 extend upwardly through a lip 82 (FIG. 4b) on the base frame 78, and further through the fan shroud 74 for secure attachment to the heat sink 62, as by binding fit into inter-fin spaces as shown in FIG. 2.

Figure 4B:
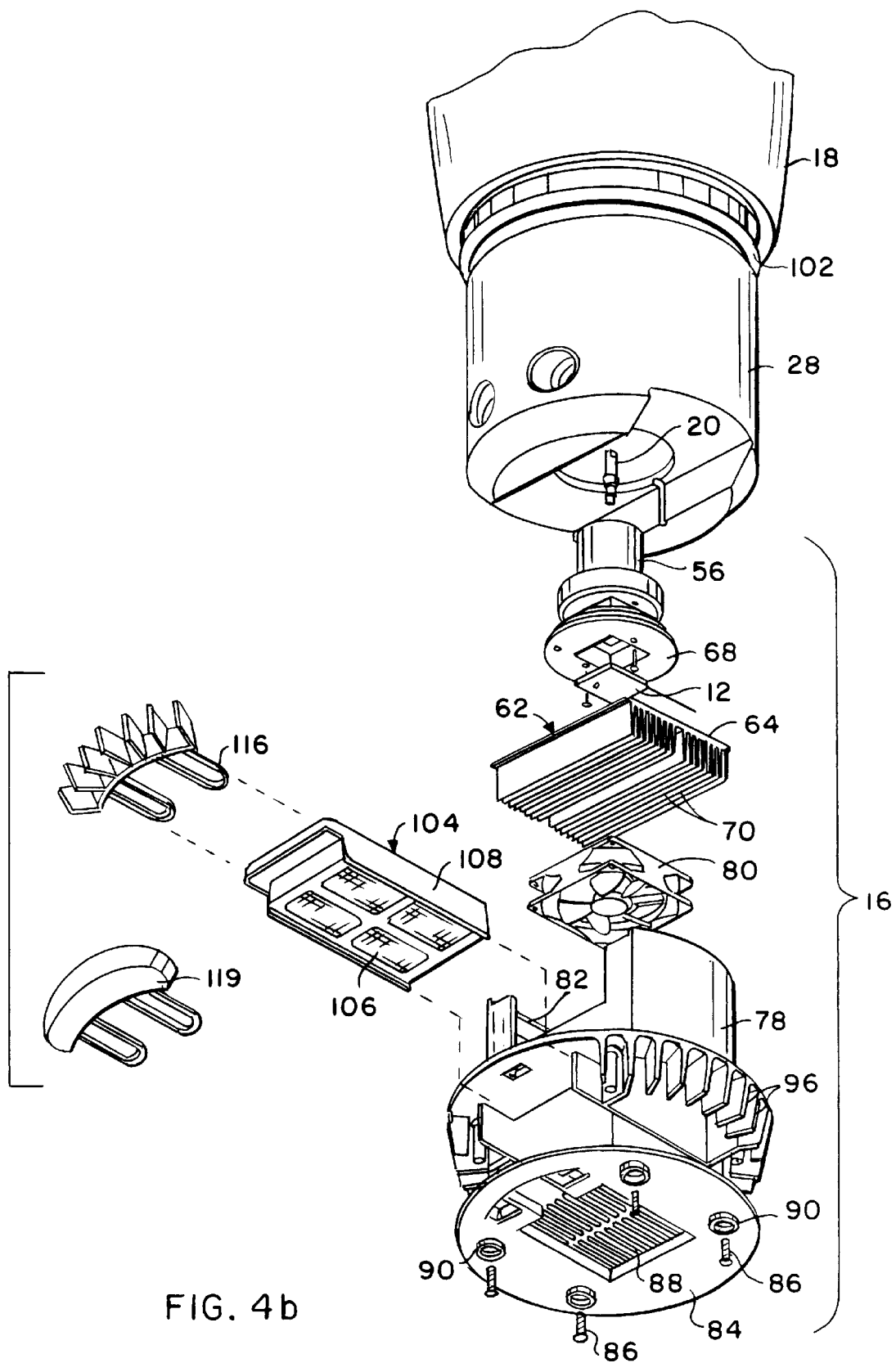

The base frame 78 is assembled with a lower support tray 84 by means of a plurality of screws 86, as shown in FIG. 4b. When assembled, the inlet duct 76 defined by the base frame 78 opens downwardly to the exterior of the water cooler 10 through an open grille 88 formed in the support tray 84. Short feet 90 on the underside of the support tray 84 space the tray above a supporting counter top surface to permit air flow to be drawn by the fan upwardly through the grille 88 and the inlet duct 76 into heat transfer relation with the heat sink fins 70. This convective cooling air flow passes generally horizontally between the fins 70 into an outer outlet duct 92 (FIG. 3) of the base frame 78, where the air flow is guided downwardly for radial outward discharge through a plurality of outlet ports 94 defined about an exposed lower perimeter of the base frame 78 and the support tray 84. This perimeter is conveniently lined with a plurality of additional fins 96 for improved heat transfer.

In accordance with one primary aspect of the invention, the chiller subassembly 16 is provided as a pre-assembled unit for quick and easy mounting onto the cooler housing 18. That is, the thermoelectric module 12 is sandwiched between the chiller probe 56 and the heat sink 62, followed by appropriate attachment of the cooling fan 72 between the base frame 78 and the heat sink 62. The lower support tray 84 is then fastened onto the base frame 78 to provide the chiller subassembly 16. A plurality of upstanding latch tabs 98 of the base frame 78 are positioned for engagement with latch keepers 100 formed on a mounting ring 102 at an open bottom end of the cooler housing 18. This mounting ring 102 may be conveniently provided as a plastic molded component for snap fit installation onto an in-tuned rib 103 at an open lower end of the housing 18, particularly when the housing is formed from ceramic or the like. These latch tabs 98 and latch keepers 100 are designed for rapid interengagement as by a part-circle rotation of the chiller subassembly 16 relative to the housing 18, to quickly and easily install the chiller subassembly within the housing. When installed, the base frame 78 provides a convenient substrate to support and position the insulation block 28. Disassembly and removal of the chiller subassembly 16 is accomplished with similar speed and ease, in the event that the chiller subassembly requires service and/or replacement.

An air filter 104 is provided along the inlet duct 76 to filter air drawn into and through the heat sink 62. This air filter 104 comprises a porous filter element 106 carried by an open lattice frame 108 for vertical flow-through passage of the convective cooling air. A pull flange 110 is formed on the front of the filter frame 108 to facilitate slide-in placement and slide-out removal of the filter through an access slot 112 defined at the front of the cooler between the base frame 78 and the lower support tray 84. Accordingly, the air filter 104 can be readily accessed and replaced from the front of the cooler housing 18. When the filter is installed, a decorative finned element 114 can be provided to close the access slot 112, with one or more lock arms 116 adapted to removably engage detents 118 (FIG. 2) on the support tray 84. Alternately, the decorative finned element 114 can be substituted for a conventional drip tray 119 (FIG. 4) positioned beneath the faucets 36, 38.

In accordance with another primary aspect of the invention, the chiller subassembly 16 includes the conductivity sensor 20 for monitoring the presence of and regulating the growth of an the ice bank 21 formed within the cooler reservoir 14. More specifically, operation of the heat transfer module 12 is effective to chill water within the lower reservoir chamber 32 and, over time, to develop an ice layer or bank covering the cold surface of the chiller probe 56. It is desirable to form and maintain this ice bank 21 for substantially immediate chilling of make-up water introduced into the lower chamber 32 following dispensing of water therefrom with the associated faucet 36. However, it is desirable to regulate the size of the ice bank 21 to prevent freeze-up of the lower chamber 32, and further to prevent excessive energy use by the thermoelectric heat transfer module 12.

The conductivity sensor 20 is shown mounted in the preferred form on the tip or distal end of the chiller probe 56 and projects therefrom a short distance into the reservoir interior. The sensor comprises a conductivity probe of the type described in U.S. Pat. Nos. 5,580,444; 5,527,450; and 5,435,904, which are incorporated by reference herein, to include a pair of electrodes 120 for contacting the water and taking periodic conductivity readings, all under the operational control of the controller 22 which includes a conductivity circuit of the type described in said referenced patents. In this regard, the electrodes 120 are coupled to the controller 22 by conductors 121 (FIG. 5) passing through a bore 122 (FIG. 2) formed in the chiller probe 56. In the present invention, a substantial step function decrease in measured conductivity indicates that the ice bank 21 has grown sufficiently to cover the sensor 20 and bridge the electrodes 120. Alternately, it will be understood that the sensor 20 can be mounted at other locations within the reservoir to detect ice bank growth on the chiller probe 56.

Figure 5:
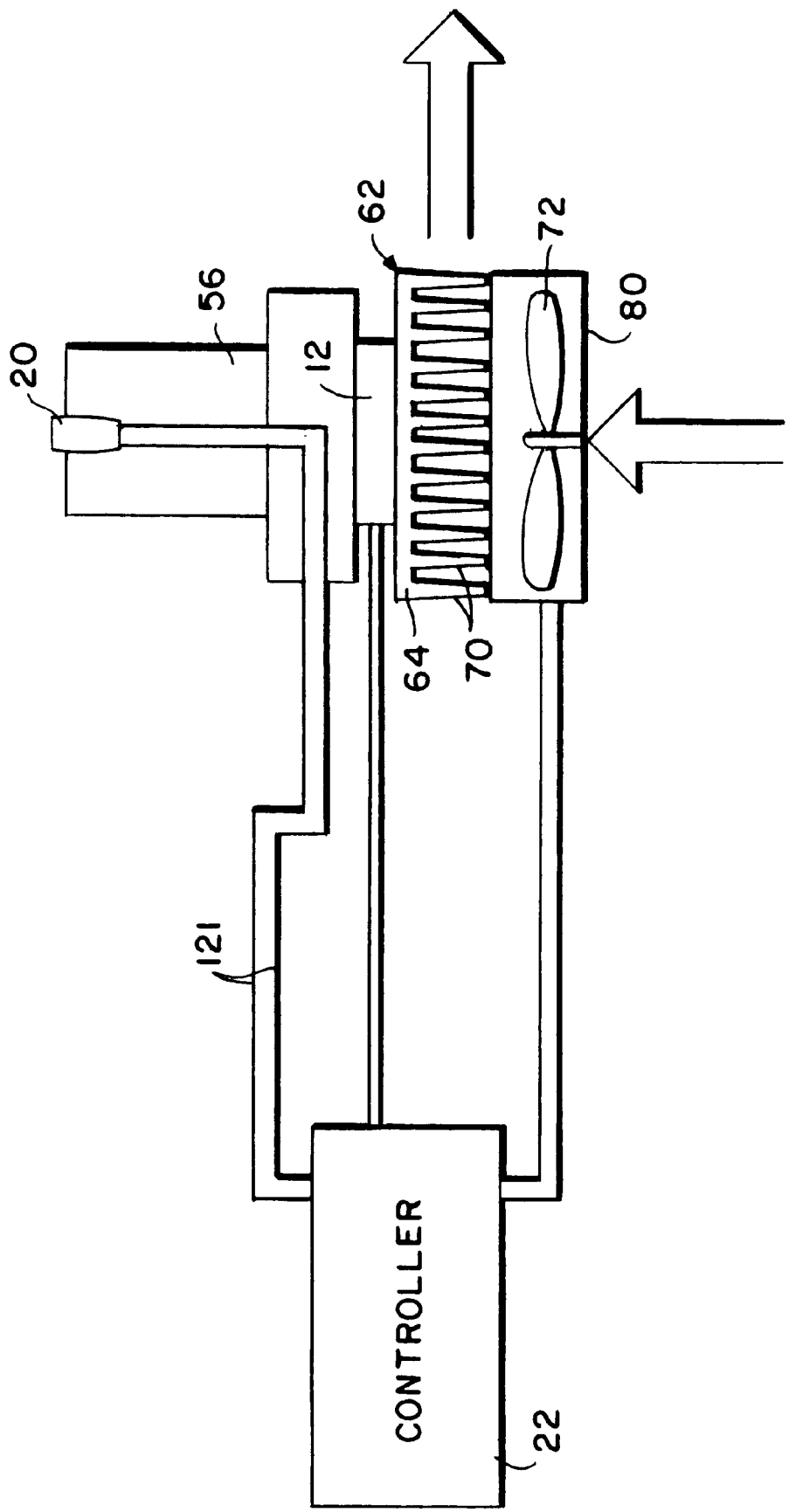
FIG. 5 is a schematic diagram illustrating a controller for use in regulating operation of the water cooler.

When the controller 22 recognizes ice bank growth sufficient to cover the sensor 20, as described above, the controller functions to regulate operation of the chiller subassembly 16 in a manner achieving the desired maintenance of the ice bank 21 without excessive ice bank growth. As depicted in FIG. 5, such regulation may occur in a preferred form by cycling the thermoelectric module 12 off and on, in response to cyclic growth and melting of the ice bank to respectively cover and uncover the sensor 20. Such cyclic operation may be initiated immediately upon detection of the ice bank to cover the sensor 20, or after a predetermined time delay period following such detection. Alternately, the module 12 can be operated at a reduced power level by pulse width modulation, thereby permitting the ice bank to shrink slowly until full power is restored when the sensor is uncovered as indicated by a detected increase in measured conductivity. A further regulatory approach which can be employed separately or in combination with the foregoing includes varying the speed of the cooling fan 72 to decrease fan speed and resultant heat transfer from the reservoir when the sensor 20 is covered by the ice bank. Regardless of the specific regulatory approach or combination thereof, the controller 22 responds to the sensor 20 to insure that the ice bank 21 is maintained generally within a preselected range of sizes as the sensor electrodes 120 are alternately covered and uncovered as the ice bank grows and melts.

If desired, the controller 22 may also include or be associated with a manually operated fan speed switch 23, as viewed in FIG. 5, to permit user selected setting of the speed of the fan 72 at a high or low speed setting. This fan speed switch 23 thus enables the fan speed and the resultant fan noise to be set by the user at a reduced level when desired, for example, during night time operation. The speed switch 23 can be mounted on the housing 18 at a convenient and typically out-of-the-way location, such as on the rear of the housing 18.

Figure 6:
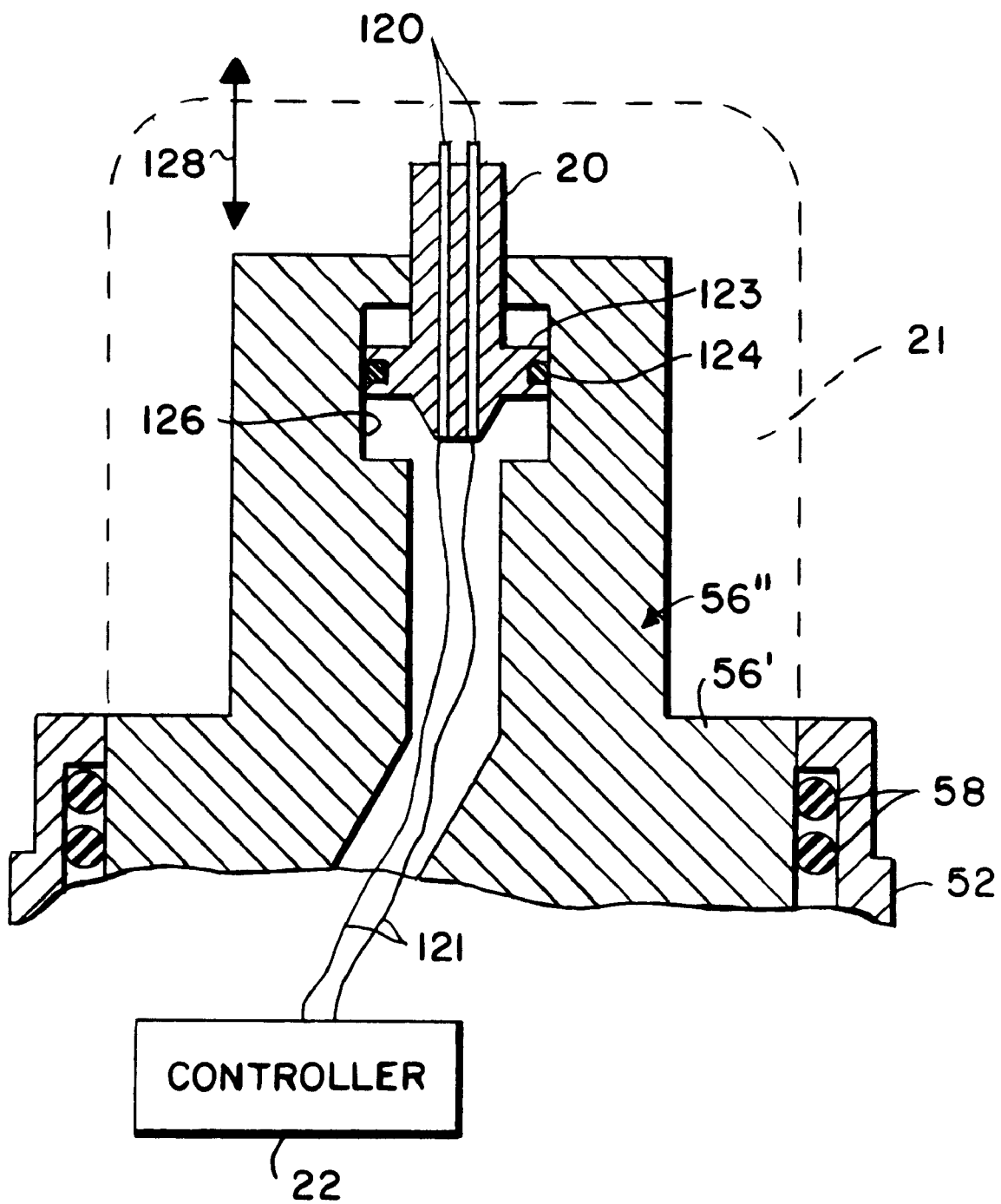
FIG. 6 is a fragmented vertical sectional view illustrating a chiller probe in accordance with one alternative preferred form of the invention.

FIG. 6 shows the chiller probe 56 in one alternative preferred form, with the sensor 20 again mounted on the tip or distal end thereof to monitor and regulate growth of the ice bank 21. In this version of the invention, the sensor 20 including the conductivity sensor electrodes 120 is mounted onto the chiller probe 56 in a manner permitting adjustment of the position of the electrode tips relative to the chiller probe 56. More specifically, FIG. 6 shows the sensor 20 to include a spool member 123 carrying an O-ring seal 124 or the like for slide-fit positional adjustment within a bore 126 formed in the chiller probe. With this construction, the position of the sensor 20 can be variably set, as indicated by arrow 128 in FIG. 6, to select the relative size to which the ice bank 21 is allowed to grow before the sensor 20 detects and begins to regulate the ice bank size. Alternately, it will be understood that other sensor adjustment structures may be used, such as a threaded interconnection between the spool member 123 and the chiller probe bore 126.

FIG. 6 also depicts a preferred geometry for the chiller probe 56, to comprise a relatively large diameter base 56' seated and sealed within the reservoir collar 52 in combination with an upwardly projecting chiller probe element 56" of considerably smaller diametric size. With this configuration, when the ice bank 21 is formed, the ice bank tends to generate with an approximate cylindrical shape building from the base 56' to cover the balance of the chiller probe within the water reservoir. As cold water is drawn from the reservoir through the appropriate faucet 36 (FIG. 1), make-up water flows through the baffle plate 30 (FIGS. 2 and 3) from the upper chamber 34 to the lower chilled water chamber 32 into direct contact with the cylindrical ice bank 21. As a result, the make-up water is chilled rapidly so that chilled water at a desirably low temperature is made available within the lower chilled water chamber 32 in a shorter period of time.

Figure 7:
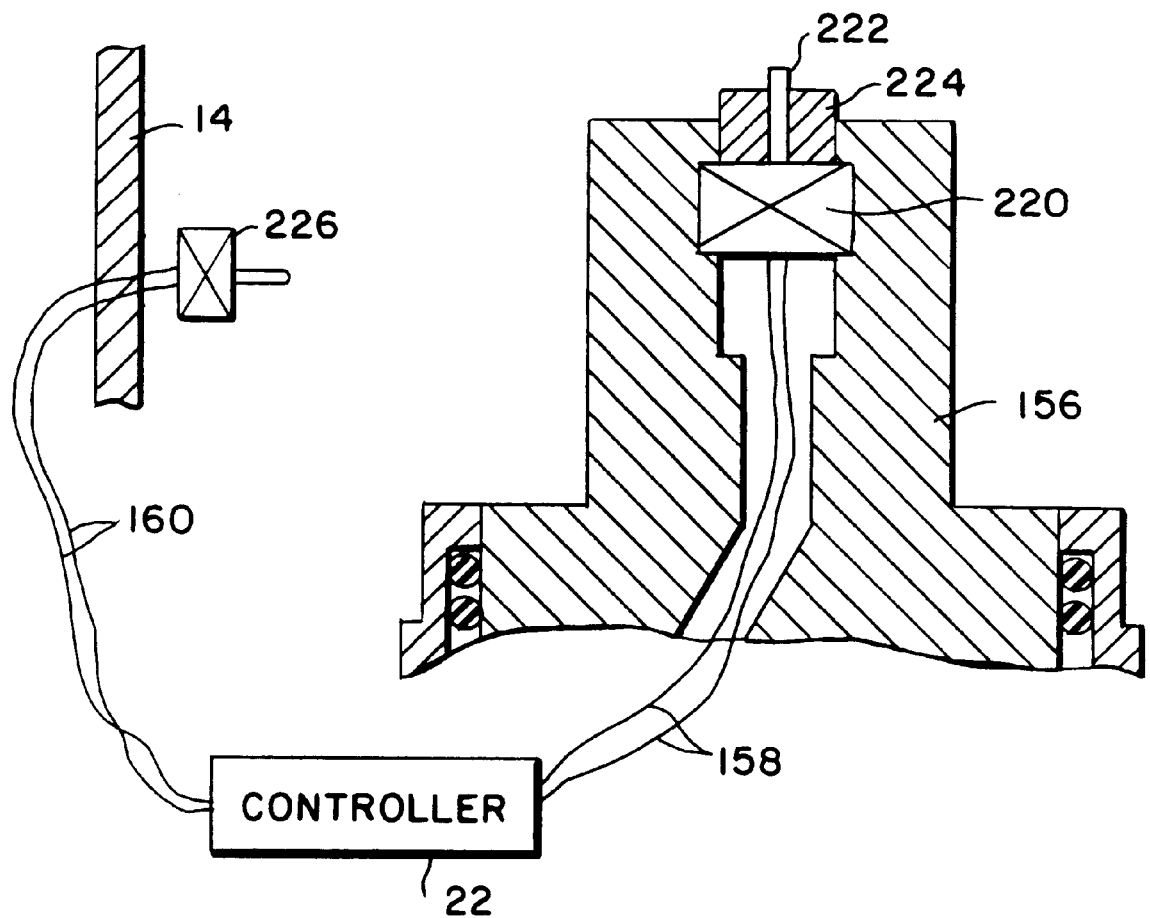
FIG. 7 is a fragmented vertical sectional view similar to FIG. 6 and showing another alternative preferred form of the invention.

FIG. 7 shows an alternative chiller probe 156 modified to incorporate an alternative system for monitoring and detecting the ice bank. In this embodiment, the ice bank sensor comprises a transducer 220 shown mounted onto the tip of the chiller probe 156, wherein the transducer is electrically connected to the controller 22 by appropriate conductors 158 and includes a vibratory rod 222 in contact with the water within the reservoir. This vibratory rod 222 may be seated in an appropriate seal grommet 224 to prevent water leakage through the probe 156. In operation, unless and until covered by the ice bank, the vibratory rod 222 produces a vibratory signal of selected frequency for detection by a suitable receiver 226 mounted at any convenient location within the reservoir 14. When the vibratory rod 222 is covered by the ice bank, the vibratory signal is interrupted. The absence of the vibratory signal is detected by the receiver 226 which appropriately signals the controller 22 via conductors 160 to initiate regulatory action as previously described. While the receiver 226 is shown schematically in FIG. 7 mounted at a location remote from the chiller probe 156, it will be understood that the receiver may be mounted directly on the chiller probe, if desired. Still further, is will be recognized and appreciated that the controller 22 can be designed to monitor the power input to the vibratory transducer 220, and to detect changes in such power input when the ice bank covers up and fixes the vibratory rod 222 against further movement.

Figure 8:
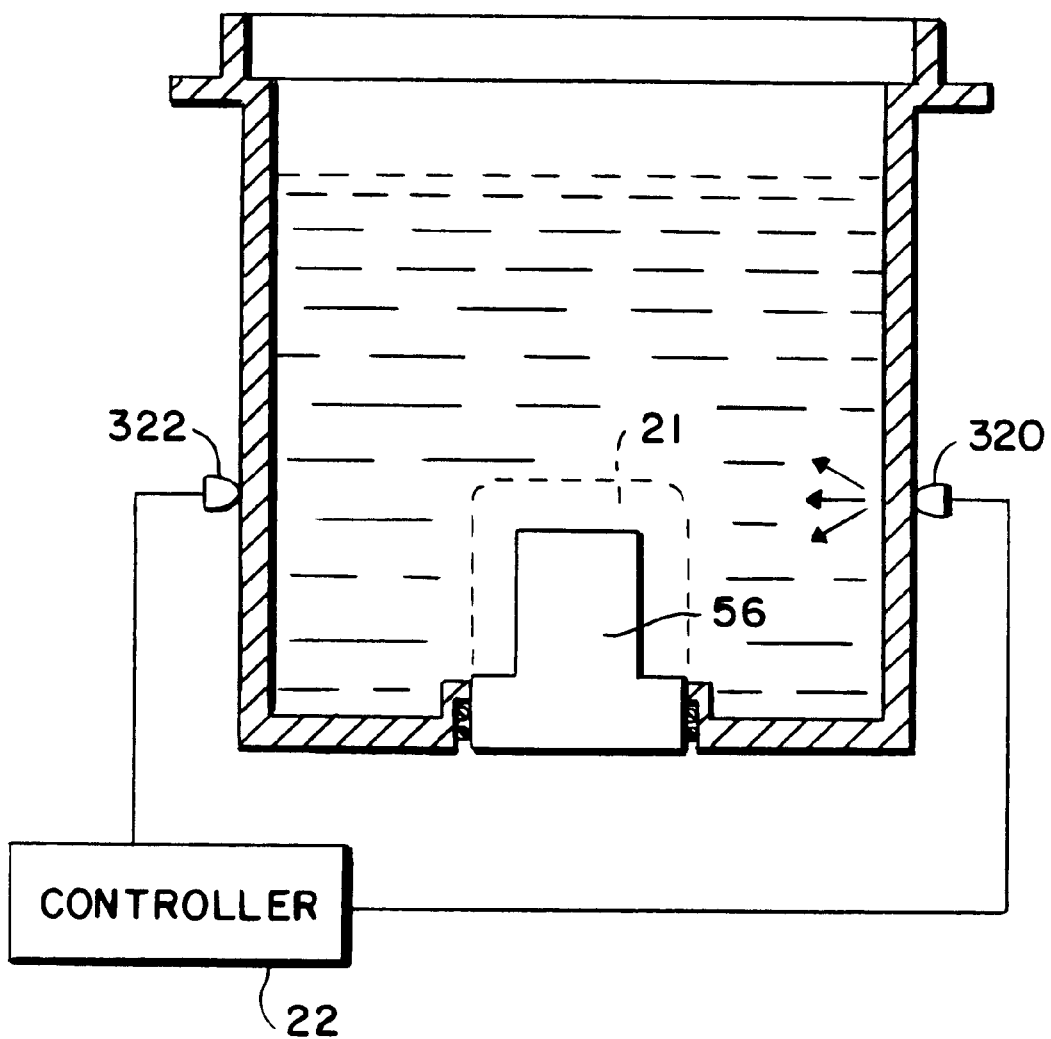
FIG. 8 is a somewhat schematic diagram depicting still another alternative preferred form of the invention.

FIG. 8 shows still another alternative ice bank sensor concept in accordance with the invention, wherein the sensors shown and described in FIGS. 1–7 on the chiller probe are replaced by an optical sensor system including a light source 320 and a light detector 322 mounted at opposite sides of the reservoir generally at opposites side of the chiller probe. The source and detector 320, 322 are positioned in alignment with each other to enable a light beam from the source 320 to pass across the top of the chiller probe 56 for sensing by the detector 322. When the ice bank 21 grows to a sufficient size, the ice bank interrupts the light beam. The controller 22 is coupled to the detector 322 so that the controller can respond to such light beam interruption indicative of ice bank growth for appropriate regulatory action. In a preferred system, the light source 320 and the light detector 322 are infrared components suitable for passage of the light signal through plastic walls of the reservoir 14.

Figure 9:
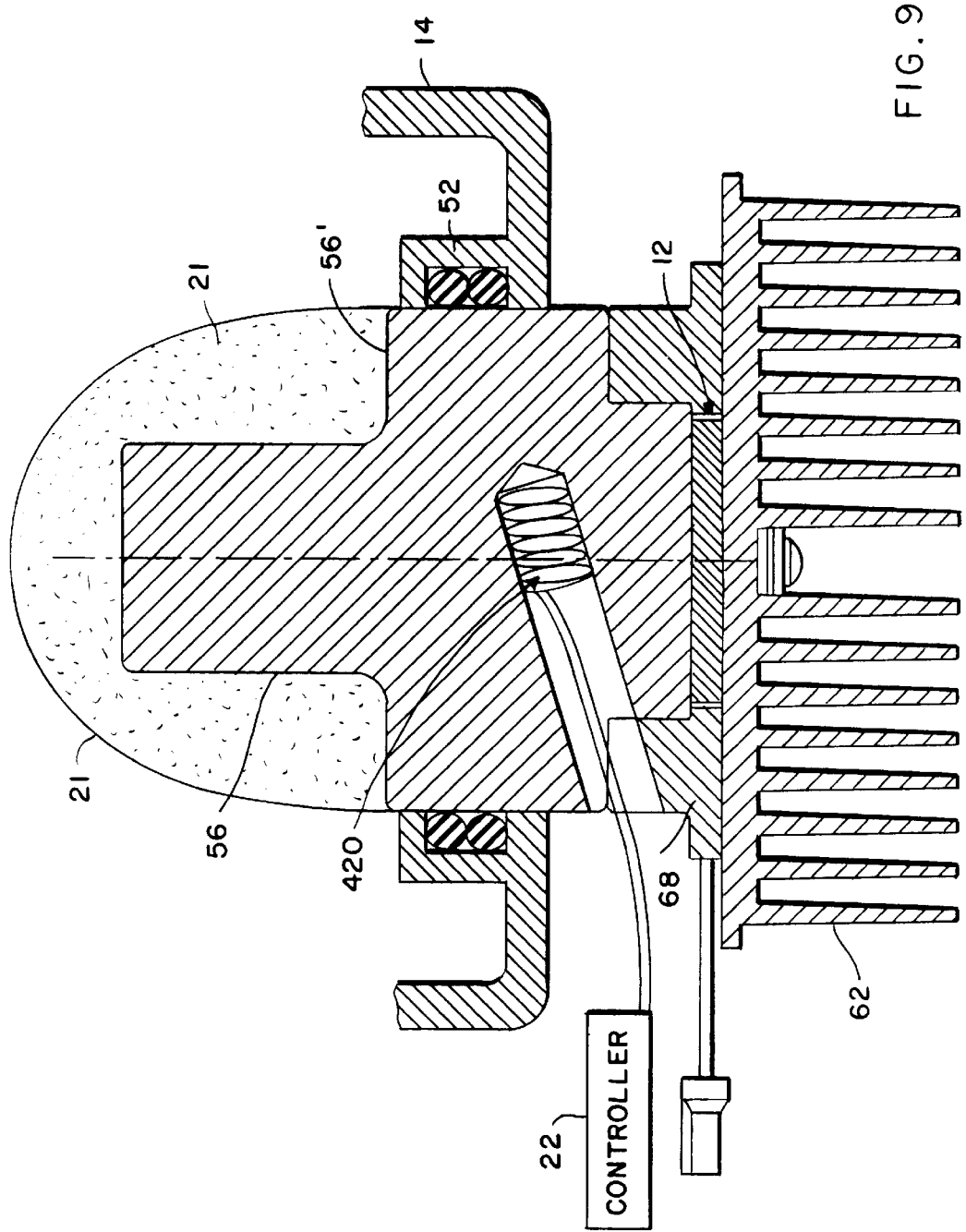
FIG. 9 is a fragmented vertical sectional view depicting a further alternative preferred form of the invention.

A further alternative and preferred form on the invention is shown in FIG. 9, wherein the sensor comprises a temperature sensor 420 coupled to the controller 22 and having a sensor bulb embedded within the chiller probe 56. At this location, the sensor 420 is located essentially in-line along the thermal path between the cold side of the thermoelectric module 12 and the ice bank 21 and/or the liquid being chilled within the reservoir 14. In this version, as the ice bank 21 grows on the chiller probe, the ice banks acts as to insulate the probe 56 and the sensor 420 embedded therein from the water within the reservoir. As a result, heat transfer from the water is reduced and the temperature detected by the sensor 420 is also reduced. At a predetermined low temperature level, the sensor 420 signals the controller 22 to initiate regulatory operation, as previously described. In a preferred control arrangement, the controller 22 operates the thermoelectric module 12 in an on-off or similar cyclic manner allowing the ice bank 21 to melt sufficiently to detach and float upwardly from the probe 56. This will expose the probe base 56' to a higher temperature, thereby also exposing the sensor 420 to a higher temperature for appropriate regulatory operation. However, the proximity of the baffle 30 (not shown in FIG. 9) to the ice bank 21 will prevent the ice bank from separating completely from the chiller probe, so that resumed chiller operation of the module 12 re-builds the ice bank at its base. The net result is that the system maintains an elongated ice bank extending upwardly from the probe 56 substantially to a point near the baffle 30 for effective water chilling. Although the upper end of the ice bank progressively melts within the reservoir, the overall size of the ice bank and chilling capacity provided thereby is increased.

The thermoelectric water cooler 10 of the present invention thus provides a compact chiller subassembly 16 including the heat transfer module 12 for quick and easy installation into and removal from the housing 18 of a water cooler. The chiller subassembly 16 includes an air filter 104 mounted for facilitated access from the front of the cooler housing. In addition, the sensor permits ice bank growth to be maintained and regulated within a predetermined size range in a manner consistent with optimized water cooler performance and efficient energy usage.

A variety of further improvements and advantages in and to the present invention will be apparent to persons skilled in the art. For example, while the invention has been shown and described relative to a counter top style water cooler, it will be recognized and understood that the invention is equally applicable to water coolers of other housing configurations. Accordingly, no limitation on the invention is intended by way of the foregoing description and accompanying drawings, except as set forth in the appended claims.

What is claimed is:

1. A water cooler, comprising:
   a reservoir for receiving and storing a supply of water;
   dispense means for dispensing water from said reservoir;
   chiller means mounted in heat exchange relation with water within said reservoir; and
   control means for regulating said chiller means to produce an ice bank of regulated size within said reservoir, said control means including sensor means mounted on said chiller means for detecting the size of the ice bank, and a controller responsive to said sensor means for operating said chiller means to maintain the ice bank within a predetermined size range.

2. The water cooler of claim 1 wherein said dispense means comprises a faucet mounted on said reservoir.

3. The water cooler of claim 1 wherein said chiller means comprises a thermoelectric heat transfer module having a cold side mounted in heat transfer relation with water within said reservoir.

4. The water cooler of claim 1 wherein said sensor means comprises a conductivity sensor.

5. The water cooler of claim 1 wherein said chiller means comprises a chiller probe positioned within said reservoir in contact with water therein, and further wherein said sensor means comprises a sensor mounted on said chiller probe and protruding therefrom for contacting water within said reservoir, said control means regulating said chiller means to form the ice bank on said chiller probe within said reservoir.

6. The water cooler of claim 5 wherein said sensor is adjustably mounted on said chiller probe to permit selection of the distance said sensor protrudes from said chiller probe into said reservoir.

7. The water cooler of claim 5 wherein said sensor comprises a conductivity sensor having a pair of electrodes exposed to water within said reservoir, said controller including means for applying electrical signals to said electrodes to take conductivity readings.

8. The water cooler of claim 1 wherein said sensor means comprises a temperature sensor.

9. The water cooler of claim 8 wherein said chiller means comprises a chiller probe positioned in thermal heat transfer relation with water within said reservoir, and further wherein said temperature sensor is mounted within said chiller probe.

10. The water cooler of claim 9 wherein said chiller means further comprises a thermoelectric heat transfer module mounted in heat transfer relation with said chiller probe to chill said probe, said temperature sensor being mounted on said chiller probe thermally in-line between said module and water within sad reservoir.

11. The water cooler of claim 1 wherein said chiller means comprises a base having a relatively large diametric size in combination with a chiller probe element of comparatively smaller diametric size projecting from said base into said reservoir.

12. The water cooler of claim 1 wherein said sensor means comprises a transducer having a vibratory element for delivering a vibratory signal to the water within said reservoir, and a detector for detecting said vibratory signal.

13. The water cooler of claim 1 further including a housing having said reservoir mounted therein, said chiller means comprising a chiller subassembly for removable mounting as a preassembled unit on said housing, said chiller subassembly including a chiller probe positioned within said reservoir in contact with water therein, a heat sink, a thermoelectric heat transfer module sandwiched between said chiller probe and said heat sink, and fan means for circulating a cooling air flow in heat transfer relation with said heat sink.

14. The water cooler of claim 13 wherein said sensor means comprises a sensor mounted on said chiller probe and protruding therefrom for contacting water within said reservoir, said control means regulating said chiller means to form the ice bank on said chiller probe within said reservoir.

15. The water cooler of claim 13 wherein said sensor means comprises a temperature sensor mounted within said chiller probe.

16. The water cooler of claim 13 wherein said chiller subassembly further comprises a base having said fan means mounted thereon and defining an air inlet duct and an air outlet duct to permit flow through passage of the cooling air flow.

17. The water cooler of claim 16 further including an air filter mounted along said air inlet duct.

18. The water cooler of claim 17 wherein said base of said chiller subassembly defines an open access slot for permitting access to and removal and replacement of said air filter when said chiller subassembly is mounted on said housing.

19. The water cooler of claim 18 wherein said access slot permits access to said air filter from a front side of said housing.

20. The water cooler of claim 18 further including means for removably closing said access slot.

21. The water cooler of claim 20 wherein said means for removably closing said access slot comprises a drip tray positioned below said dispense means.

22. The water cooler of claim 1 wherein said chiller means includes a heat sink for dissipating heat energy drawn from water within said reservoir, fan means for circulating a cooling air flow in heat transfer relation with said heat sink, means defining an air inlet duct and an air outlet duct to permit flow through passage of the cooling air flow past said heat sink, an air filter mounted along said air inlet duct, and means defining an open access slot for permitting access to and removal and replacement of said air filter.

23. The water cooler of claim 22 wherein said access slot permits access to said air filter from a front side of the reservoir.

24. The water cooler of claim 23 further including a drip tray for removably closing said access slot, said drip tray being positioned below said dispense means.

25. The water cooler of claim 22 wherein said chiller means comprises a thermoelectric heat transfer module having a cold side mounted in heat transfer relation with water within said reservoir, and a hot side mounted in heat transfer relation with said heat sink.

26. The water cooler of claim 22 wherein said sensor means comprises a conductivity sensor.

27. The water cooler of claim 22 wherein said sensor means comprises a temperature sensor.

28. The water cooler of claim 27 wherein said chiller means comprises a chiller probe positioned in thermal heat transfer relation with water within said reservoir, and further wherein said temperature sensor is mounted within said chiller probe.

29. The water cooler of claim 28 wherein said chiller means further comprises a thermoelectric heat transfer module mounted in heat transfer relation with said chiller probe to chill said probe, said temperature sensor being mounted on said chiller probe thermally in-line between said module and water within said reservoir.

30. The water cooler of claim 22 further including means for controlling the speed of said fan means.

31. A water cooler, comprising:
   a housing;
   a reservoir mounted within said housing for receiving and storing a supply of water, faucet means coupled to said reservoir for dispensing water therefrom; and
   a chiller subassembly mounted as a preassembled unit on said housing, said chiller subassembly comprising a chiller probe mounted in heat exchange relation with water within said reservoir, a heat sink, a thermoelectric heat transfer module sandwiched between said chiller probe and said heat sink with a cold side thereof in thermal contact with said chiller probe and a hot side thereof in thermal contact with said heat sink, fan means for circulating a cooling air flow in heat transfer relation with said heat sink, and frame means having said fan means mounted thereon and defining an air inlet duct and an air outlet duct to permit flow through passage of the cooling air flow past said heat sink;
   said chiller subassembly being removably mounted through an open lower end of said housing.

32. The water cooler of claim 31 wherein said fan means is mounted in sandwiched relation between said heat sink and said air inlet duct.

33. The water cooler of claim 31 further including means for controlling the operating speed of said fan means.

34. The water cooler of claim 31 further including an air filter mounted along said air inlet duct.

35. The water cooler of claim 34 wherein said frame means defines an open access slot for permitting access to and removal and replacement of said air filter when said chiller subassembly is mounted on said housing.

36. The water cooler of claim 35 wherein said access slot permits access to said air filter from a front side of said housing.

37. The water cooler of claim 36 further including for removably closing said access slot.

38. The water cooler of claim 37 wherein said means for removably closing said access slot comprises a drip tray positioned below said faucet means.

39. The water cooler of claim 31 further including control means for regulating said thermoelectric module to produce an ice bank of regulated size within said reservoir, said control means including sensor means mounted within said reservoir for detecting the size of the ice bank, and a controller responsive to said sensor means for operating said thermoelectric module to maintain the ice bank within a predetermined size range.

40. The water cooler of claim 39 wherein said sensor means comprises a conductivity sensor.

41. The water cooler of claim 39 wherein said sensor means comprises a temperature sensor.

42. The water cooler of claim 39 wherein said chiller probe is positioned within said reservoir in contact with water therein, and further wherein said sensor means comprises a sensor mounted on said chiller probe and protruding therefrom for contacting water within said reservoir, said control means regulating said thermoelectric module to form the ice bank on said chiller probe within said reservoir.

43. The water cooler of claim 42 wherein said sensor is adjustably mounted on said chiller probe to permit selection of the distance said sensor protrudes from said chiller probe into said water reservoir.

44. The water cooler of claim 42 wherein said sensor comprises a conductivity sensor having a pair of electrodes exposed to water within said reservoir, said controller including means for applying electrical signals to said electrodes to take conductivity readings.

45. The water cooler of claim 39 wherein said sensor means comprises a transducer having a vibratory element for delivering a vibratory signal to the water within the reservoir, and detector for detecting said vibratory signal.

46. The water cooler of claim 41 wherein said temperature sensor is mounted within said chiller probe thermally in-line between said heat sink and water within said reservoir.

47. The water cooler of claim 31 wherein said frame means defines a downwardly open grille for air entry into said air inlet duct, and a plurality of outlet ports formed generally about a periphery thereof below said housing for air discharge from said air outlet duct.

48. The water cooler of claim 47 including interengageable latch members on said frame means and said housing for releasible engagement and disengagement by part-circle rotation of said chiller subassembly relative to said housing.

49. A water cooler, comprising:
   a housing;
   a reservoir mounted within said housing for receiving and storing a supply of water;
   faucet means coupled to said reservoir for dispensing water therefrom; and
   chiller means for chilling water within said reservoir, said chiller means comprising a chiller probe mounted in heat transfer relation with water within said reservoir, a heat sink for dissipating heat energy from said chiller probe, fan means for circulating a cooling air flow in heat transfer relation with said heat sink, frame means defining an air inlet duct and an air outlet duct to permit flow through passage of the cooling air flow past said heat sink, and an air filter mounted along said air inlet duct;

said frame means defining an open access slot to permit access to and removal and replacement of said air filter.

50. The water cooler of claim 49 wherein said fan means is mounted in sandwiched relation between said heat sink and said air inlet duct.

51. The water cooler of claim 49 wherein said access slot permits access to said air filter from a front side of said housing.

52. The water cooler of claim 51 further including means for removably closing said access slot.

53. The water cooler of claim 52 wherein said means for removably closing said access slot comprises a drip tray positioned below said faucet means.

54. A water cooler, comprising:

a housing;

a reservoir mounted within said housing for receiving and storing a supply of water;

faucet means coupled to said reservoir for dispensing water therefrom;

a chiller subassembly mounted as a preassembled unit on said housing, said chiller subassembly comprising a chiller probe mounted in heat exchange relation with water within said reservoir, a heat sink, a thermoelectric heat transfer module sandwiched between said chiller probe and said heat sink with a cold side thereof in thermal contact with said chiller probe and a hot side thereof in thermal contact with said heat sink, fan means for circulating a cooling air flow in heat transfer relation with said heat sink, and frame means having said fan means mounted thereon and defining an air inlet duct and an air outlet duct to permit flow through passage of the cooling air flow past said heat sink; and means for controlling the operating speed of said fan means.

55. A water cooler, comprising:

a housing;

a reservoir mounted within said housing for receiving and storing a supply of water;

faucet means coupled to said reservoir for dispensing water therefrom;

a chiller subassembly mounted as a preassembled unit on said housing, said chiller subassembly comprising a chiller probe mounted in heat exchange relation with water within said reservoir, a heat sink, a thermoelectric heat transfer module sandwiched between said chiller probe and said heat sink with a cold side thereof in thermal contact with said chiller probe and a hot side thereof in thermal contact with said heat sink, fan means for circulating a cooling air flow in heat transfer relation with said heat sink, and frame means having said fan means mounted thereon and defining an air inlet duct and an air outlet duct to permit flow through passage of the cooling air flow past said heat sink; and an air filter mounted along said air inlet duct.

56. The water cooler of claim 55 wherein said frame means defines an open access slot for permitting access to and removal and replacement of said air filter when said chiller subassembly is mounted on said housing.

57. The water cooler of claim 56 wherein said access slot permits access to said air filter from a front side of said housing.

58. The water cooler of claim 57 further including for removably closing said access slot.

59. The water cooler of claim 58 wherein said means for removably closing said access slot comprises a drip tray positioned below said faucet means.

60. A water cooler, comprising:

a housing;

a reservoir mounted within said housing for receiving and storing a supply of water;

faucet means coupled to said reservoir for dispensing water therefrom;

a chiller subassembly mounted as a preassembled unit on said housing, said chiller subassembly comprising a chiller probe mounted in heat exchange relation with water within said reservoir, a heat sink, a thermoelectric heat transfer module sandwiched between said chiller probe and said heat sink with a cold side thereof in thermal contact with said chiller probe and a hot side thereof in thermal contact with said heat sink, fan means for circulating a cooling air flow in heat transfer relation with said heat sink, and frame means having said fan means mounted thereon and defining an air inlet duct and an air outlet duct to permit flow through passage of the cooling air flow past said heat sink; and control means for regulating said thermoelectric module to produce an ice bank of regulated size within said reservoir, said control means including sensor means mounted within said reservoir for detecting the size of the ice bank, and a controller responsive to said sensor means for operating said thermoelectric module to maintain the ice bank within a predetermined size range;

said chiller probe being positioned within said reservoir in contact with water therein, and further wherein said sensor means comprises a sensor mounted on said chiller probe and protruding therefrom for contacting water within said reservoir, said control means regulating said thermoelectric module to form the ice bank on said chiller probe within said reservoir.

61. The water cooler of claim 60 wherein said sensor is adjustably mounted on said chiller probe to permit selection of the distance said sensor protrudes from said chiller probe into said water reservoir.

62. The water cooler of claim 60 wherein said sensor comprises a conductivity sensor having a pair of electrodes exposed to water within said reservoir, said controller including means for applying electrical signals to said electrodes to take conductivity readings.

* * * * *